(12) United States Patent
Setogawa

(10) Patent No.: US 6,472,907 B2
(45) Date of Patent: Oct. 29, 2002

(54) INPUT BUFFER OF A SEMICONDUCTOR DEVICE THAT GIVES ONLY A SMALL SCATTERING IN DELAY TIME

(75) Inventor: Jun Setogawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/843,692

(22) Filed: Apr. 30, 2001

(65) Prior Publication Data

US 2002/0063581 A1 May 30, 2002

(30) Foreign Application Priority Data

Nov. 30, 2000 (JP) .................................. 2000-364691

(51) Int. Cl.$^7$ .......................................... H03K 19/0175
(52) U.S. Cl. .............................. 326/83; 326/80; 326/68; 326/86; 365/235.5
(58) Field of Search ............................. 326/83, 80, 68, 326/86, 90; 365/233.5

(56) References Cited

U.S. PATENT DOCUMENTS 5,233,565 A * 8/1993 Wang ..................... 365/189.05
6,049,229 A * 4/2000 Manohar et al. ............. 326/115
6,054,876 A * 4/2000 Horie et al. ................. 326/112
6,339,344 B1 * 1/2002 Sakata et al. ................ 326/115

* cited by examiner

Primary Examiner—Michael G. Lee
Assistant Examiner—Steven S. Paik
(74) Attorney, Agent, or Firm—McDermott, Will & Emery

(57) ABSTRACT

In a semiconductor memory device, its clock buffer includes a first comparator having a pair of P channel MOS transistors whose gates receive a clock signal and a complementary clock signal, respectively, and a second comparator having a pair of N channel MOS transistors whose gates receive the clock signal and the complementary clock signal, respectively. An internal signal is generated in response to an output signal of the comparator having a shorter response time which starts correspondingly to the cross point where the clock signal and the complementary clock signal cross each other. Even if the level of the cross point is scattered, a scatter in the response time of the internal signal which starts correspondingly to the cross point becomes small.

8 Claims, 13 Drawing Sheets

INPUT BUFFER OF A SEMICONDUCTOR DEVICE THAT GIVES ONLY A SMALL SCATTERING IN DELAY TIME

BACKGROUND OF THE INVENTION

1. Field of the Invention

The present invention relates to an input buffer of a semiconductor device, and in particular to an input buffer of a semiconductor device that generates an internal signal in response to an external signal and gives the internal signal to its internal circuit.

2. Description of the Background Art

FIG. 8 is a block diagram showing a conventional semiconductor memory device. In FIG. 8, this device has a control signal buffer 51, an address buffer 52, a clock buffer 53, a data output buffer 54 and a data input buffer 55.

The control signal buffer 51 transmits an external control signal CNT including a plural-bit signal to an internal circuit 56. By the external control signal CNT, various commands such as a read command and a write command are given to the internal circuit 56.

The address buffer 52 transmits an external address signal ADD including a plural-bit signal to the internal circuit 56. The internal circuit 56 includes memory cells, each of which a specific address is assigned to. By the external address signal ADD, any one of the memory cells is designated. The clock buffer 53 synchronizes with external clock signals CLK and /CLT to generate a signal for designating output timing of data and then give the signal to the internal circuit 56.

In response to a read command, the internal circuit 56 reads data in the memory cell designated by the external address signal ADD. In response to the signal from the clock buffer 53, the read data DO is outputted through the data output buffer 54 to the outside. Write data DI is given through the data input buffer 55 to the internal circuit 56. In response to a write command, the internal circuit 56 writes the data DI in the memory cell designated by the external address signal ADD.

FIG. 9 is a circuit diagram of the clock buffer 53. In FIG. 9, the clock buffer 53 includes P channel MOS transistors 61 and 62, and N channel MOS transistors 63 and 64. The MOS transistors 61–64 constitute a comparator for comparing the clock signal CLK with the clock signal /CLK complementary thereto so as to output a signal VO having a level corresponding to the result of the comparison.

In the case that the level of the clock signal CLK is lower than that of the clock signal /CLK, the electric current flowing through the MOS transistors 61–63 becomes smaller than that flowing through the MOS transistor 64 so that the signal VO is at an "L" level. In the case that the level of the clock signal CLK is higher than that of the clock signal /CLK, the electric current flowing through the MOS transistors 61–63 becomes larger than that flowing through the MOS transistor 64 so that the signal VO is at an "H" level. When the clock signal CLK is raised up from the "L" level (ground potential GND) to the "H" level (power source VCC) and the clock signal /CLK is fallen down from the "H" level to the "L" level, the signal VO is raised from the "L" level to the "H" level. The read data DI is outputted through the data output buffer 54 to the outside, in synchronization with the rising edge of the signal VO.

FIG. 10 is a circuit diagram of the data input buffer 55. In FIG. 10, the data input buffer 55 includes P channel MOS transistors 71 and 72, N channel MOS transistors 73 and 74, and an inverter 75. The MOS transistors 71–74 and the inverter 75 constitute a comparator for comparing the level of the external data signal DI with a reference potential VR (VCC/2) to output a signal VO corresponding to the result of the comparison.

In the case that the level of the data signal DI is lower than the reference potential VR, the electric current flowing through the MOS transistor 74 becomes smaller than that flowing through the MOS transistors 71–73 so that the signal VO is at the "L" level. In the case that the level of the data signal DI is higher than the reference potential VR, the electric current flowing through the MOS transistor 74 becomes larger than that flowing through the MOS transistors 71–73 so that the signal VO is at the "H" level. The signal VO is written in the selected memory cell in the external circuit 56.

However, such a conventional semiconductor memory device has the following problem.

FIGS. 11A and 11B are timing charts showing operation of the clock buffer 53 shown in FIG. 9. The clock signal CLK is raised up from the "L" level to the "H" level and the clock signal /CLK is fallen down from the "H" level to the "L" level, so that the signal VO is raised up from the "L" level to the "H" level at the cross point where the clock signals CLK and /CLK cross each other. In this case, the response time for the rise from the "L" level of the signal VO to the midpoint level (VCC/2) thereof, which starts correspondingly to the cross point, varies dependently on the level of the cross point.

Specifically, the response time $\Delta t1$ in the case that the level of the cross point is higher than VCC/2 (FIG. 11A) is shorter than the response time $\Delta t2$ in the case that the level of the cross point is lower than VCC/2 (FIG. 11B). This is based on the following reason. As shown in FIG. 12, electric current I flowing through the N channel MOS transistors 63 and 64 is not in proportion to input potential VI (the level of the clock signals CLK and /CLK). Thus, when the input potential VI of the N channel MOS transistors 63 and 64 is high, the ratio of electric current variation $\Delta I1$ to potential variation $\Delta V1$ (i.e., $\Delta I1/\Delta V1$) is relatively large. On the other hand, when the input potential VI of the N channel MOS transistors 63 and 64 is low, the ratio of electric current variation $\Delta I2$ to potential variation $\Delta V2$ (i.e., $\Delta I2/\Delta V2$) is relatively small.

As described above, in conventional semiconductor memory devices, the response time of the signal VO, which starts correspondingly to the cross point of the clock signals CLK and /CLK, is scattered. Therefore, access time is also scattered so that the operation of the semiconductor memory devices is disturbed from being made speedy.

FIGS. 13 A and B are time charts of the data input buffer 55 shown in FIG. 10. The data signal DI is raised up from the "L" level to the "H" level, so that the signal VO is raised up from the "L" level to the "H" level at the cross point where the data signal DI and the reference potential VR cross each other. The data signal DI is fallen down from the "H" level to the "L" level, so that the signal VO is fallen down from the "H" level to the "L" level at the cross point where the data signal DI and the reference potential VR cross. In this case, the response time $\Delta tH$ for the rise from the "L" level of the signal VO to the midpoint level thereof, which starts correspondingly to the cross point, is shorter than the response time $\Delta tL$ for the fall from the "H" level of the signal VO to the midpoint level thereof, which starts correspondingly to the cross point.

This is based on the following reason. As shown in FIG. 14, electric current I flowing through the N channel transistor 74 is not in proportion to input potential VI (the level of the data signal DI). Thus, when the input potential VI of the N channel MOS transistor 74 is higher than the reference potential VR, the ratio of electric current variation $\Delta IH$ to potential variation $\Delta VH$ (i.e., $\Delta IH/\Delta VH$) is relatively large. On the other hand, when the input potential VI of the N channel MOS transistor 74 is lower than the reference potential VR, the ratio of electric current variation $\Delta IL$ to potential variation $\Delta VL$ (i.e., $\Delta IL/\Delta VL$) is relatively small.

As described above, in conventional semiconductor memory devices, the response time of the signal VO in response to the external data signal DI is scattered. Therefore, long setup time and holding time are necessary. Thus, the operation of the semiconductor memory devices is disturbed from being made speedy.

SUMMARY OF THE INVENTION

Therefore, an object of the present invention is to provide an input buffer of a semiconductor device having a small scattering in delay time.

The input buffer of a semiconductor device according to one aspect of the present invention includes a first comparator including first and second transistors of first conduction type, input electrodes of which receive the external signal and a reference signal respectively, the first comparator changing a first signal from a first level to a second level in response to the fact that the level of the external signal exceeds the level of the reference signal; a second comparator including third and fourth transistors of second conduction type, input electrodes of which receive the external signal and the reference signal respectively, the second comparator changing a second signal from the first level to the second level in response to the fact that the level of the external signal exceeds the level of the reference signal; and a logic circuit that changes the internal signal from an inactive level to an active level in response to the fact that either one of the first or second signal turns into a third level between the first and second levels. Therefore, the internal signal is generated in response to the signal having a shorter response time among the first and second signals. Thus, even if the level of the cross point where the external signal and the reference signal cross, a scatter in the response time of the internal signal, which starts correspondingly to the cross point, can be suppressed and made small. As a result, the operation of the semiconductor device can be made speedy.

In a preferable embodiment, the first comparator changes the first signal from the second level to the first level in response to the fact that the level of the external signal becomes lower than the level of the reference signal. Furthermore, the second comparator changes the second signal from the second level to the first level in response to the fact that the level of the external signal becomes lower than the level of the reference signal. Furthermore, when the internal signal is at the inactive level, the logic circuit sets the internal signal to the active level in response to the fact that either one of the first or second signal turns into the third level, and when the internal signal is at the active level, the logic circuit sets the internal signal to the inactive level in response to the fact that either one of the first or second signal turns into the third level. In this case, a scatter in the response time of the internal signal, which starts correspondingly to the cross point, can be suppressed and made small even if the internal signal is changed from the active level to the inactive level.

In another preferable embodiment, the reference signal is a signal complementary to the external signal. In this case, the level of the internal signal changes correspondingly to the cross point where the external signal and the signal complementary thereto cross.

In a further preferable embodiment, one level of the external signals is equal to the first potential, and the other level is equal to the second potential. Furthermore, the reference signal is fixed to a third potential between the first and second potentials. In this case, the level of the internal signal changes correspondingly to the cross point where the external signal and the third potential cross.

In a still further embodiment, the first comparator further includes a first current mirror circuit connected to the first and second transistors. The current mirror circuit sets the first signal to the first level when a first electric current flowing through the first transistor is smaller than a second electric current flowing through the second transistor, and sets the first signal to the second level when the first electric current is larger than the second electric current. Furthermore, the second comparator further includes a second current mirror circuit connected to the third and fourth transistors. The second current mirror circuit sets the second signal to the first level when a third electric current flowing through the third transistor is larger than a fourth electric current flowing through the fourth transistor, and sets the second signal to the second level when the third electric current is smaller than the fourth electric current. In this case, the first and second comparators can easily be made.

The input buffer of a semiconductor device according to another aspect of the present invention includes a first comparator including first and second transistors of first conduction type, input electrodes of which receive the external signal and a reference potential respectively, the first comparator comparing the level of the external signal with the reference potential to output a signal having a level corresponding to the comparison result; a second comparator including third and fourth transistors of second conduction type, input electrodes of which receive the external signal and the reference potential respectively, the second comparator comparing the level of the external signal with the reference potential to output a signal having a level corresponding to the comparison result; and a selection logic circuit that receives output signals of the first and second comparators, selects the output signal of the first comparator when the external signal changes from the first level to the second level, and selects the output signal of the second comparator when the external signal changes from the second level to the first level, so as to change the level of the internal signal in response to the fact that the level of the selected signal changes. Therefore, it is possible to make the response time in the case that the external signal changes from the first level to the second level consistent with the external potential changes from the second level to the first level. As a result, the operation of the semiconductor device can be made speedy.

In a preferable embodiment, the selection logic circuit selects the output signal of either one of the first or second comparator on the basis of combination of the levels of the output signals of the first and second comparators immediately before the level of the external signal changes. In this case, the level of the internal signal changes correspondingly to change in the level of the output signal of the comparator selected on the basis of combination of the levels of the output signals of the first and second comparators.

In another preferable embodiment, the selection logic circuit receives the internal signal to select the output signal of either one of the first or second comparator on the basis of the level of the internal signal. In this case, the level of the internal signal changes correspondingly to change in the level of the output signal of the comparator selected on the basis of the level of the internal signal.

The foregoing and other objects, features, aspects and advantages of the present invention will becomes more apparent from the following detailed description of the present invention when taken in conjunction with the accompanying drawings.

DESCRIPTION OF THE PREFERRED EMBODIMENTS

First Embodiment

Figure 1:
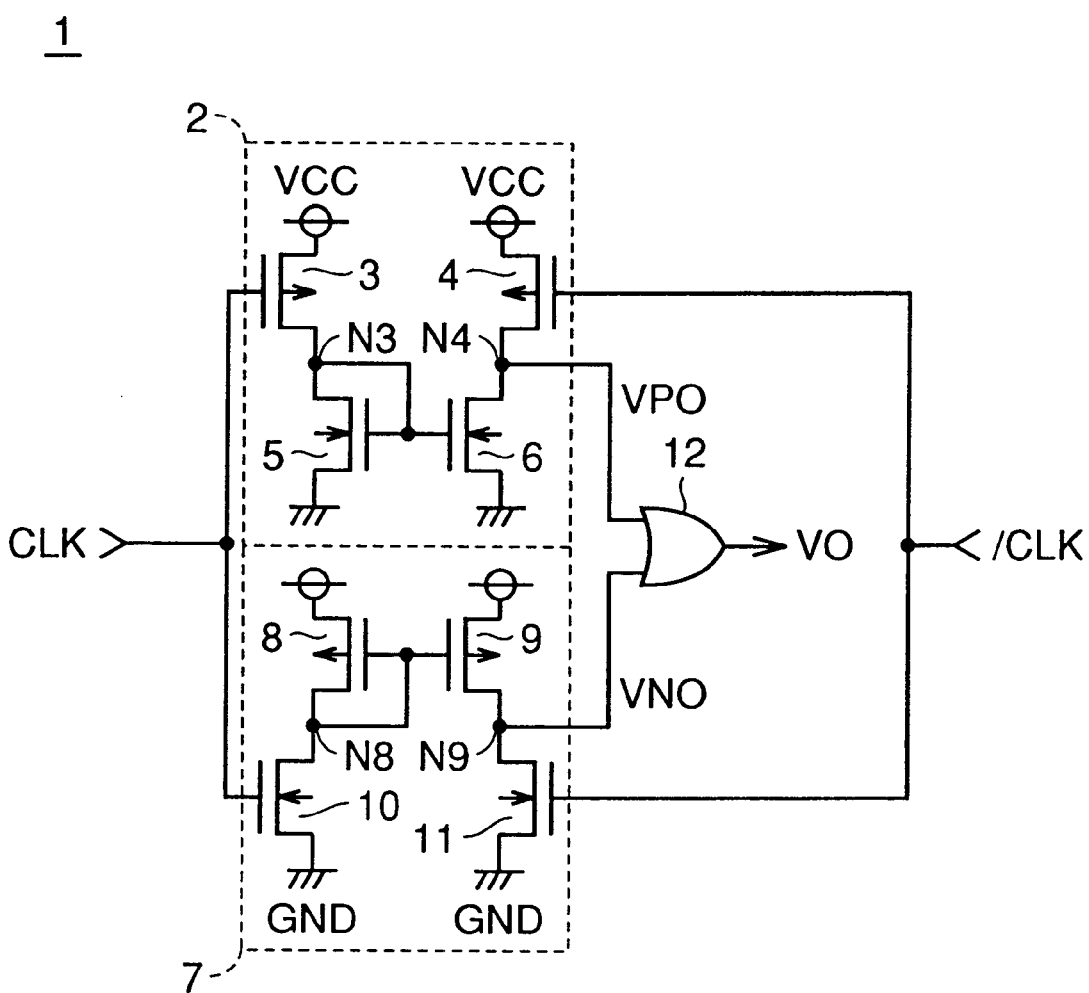
FIG. 1 is a circuit diagram of a clock buffer of a semiconductor memory device according to a first embodiment of the present invention.

FIG. 1 is a circuit diagram of a clock buffer 1 of a semiconductor memory device according to the first embodiment of the present invention. In FIG. 1, this clock buffer 1 has comparators 2 and 7, and an OR gate 12.

The comparator 2 includes P channel MOS transistors 3 and 4, and N channel transistors 5 and 6. The P channel MOS transistors 3 and 4 are connected between a line for a source potential VCC and a node N3 and between the line for the source potential VCC and a node N4, respectively. Gates of the transistors 3 and 4 receive a clock signal CLK and a clock signal /CLK complementary thereto, respectively. The N channel MOS transistor 5 and 6 are connected between the node N3 and the line for the ground potential GND and between the node N4 and the line for the ground potential GND, respectively. Respective gates thereof are connected to the node N3. The N channel MOS transistors 5 and 6 constitute a current mirror circuit. Any signal appearing at the node N4 will be an output signal VPO of the comparator 2.

Electric currents having values dependent on the clock signals CLK and/CLK flow through the P channel MOS transistors 3 and 4, respectively. The P channel MOS transistor 3 and the N channel MOS transistor 5 are connected to each other in series. Since the N channel MOS transistors constitute the current mirror circuit, an electric current having the same value flow through the MOS transistors 3 and 5. When the level of the clock signal CLK is lower than that of the clock signal /CLK, the electric current flowing through the MOS transistors 3, 5 and 6 becomes larger than that flowing through the P channel MOS transistor 4 so that the signal VPO is at the "L" level. When the level of the clock signal CLK is higher than that of the clock signal /CLK, the electric current flowing through the MOS transistors 3, 5 and 6 becomes smaller than that flowing through the P channel MOS transistor 4 so that the signal VPO is at the "H" level.

The comparator 7 includes P channel MOS transistors 8 and 9, and N channel MOS transistors 10 and 11. The P channel MOS transistor 8 and 9 are connected between the line for the source potential VCC and a node N8 and between the line for the source potential VCC and a node N9, respectively. Respective gates thereof are connected to the node N8. The P channel MOS transistors 3 and 4 constitute a current mirror circuit. The N channel MOS transistor 10 and 11 are connected between the node N8 and the line for the ground potential GND and between the node N9 and the line for the ground potential GND, respectively. Gates of the transistors 10 and 11 receive the clock signals CLK and /CLK, respectively. Any signal appealing at the node N9 will be an output signal VNO of the comparator 7.

Electric currents having values dependent on levels of the clock signals CLK and/CLK flow through the N channel MOS transistors 10 and 11, respectively. The N channel MOS transistor 10 and the P channel MOS transistor 11 are connected to each other in series. Since the P channel MOS transistors 8 and 9 constitute the current mirror circuit, an electric current having the same value flow through the MOS transistors 10, 8 and 9. When the level of the clock signal CLK is lower than that of the clock signal /CLK, the electric current flowing through the MOS transistors 10, 8 an 9 becomes smaller than that flowing through the N channel MOS transistor 11 so that the signal VNO is at the "L" level. When the level of the clock signal CLK is higher than that of the clock signal /CLK, the electric current flowing through the MOS transistors 10, 8 and 9 becomes larger than that flowing through the N channel MOS transistor 11 so that the signal VNO is at the "H" level.

The OR gate 12 receives the signals VPO and VNO, and then outputs a logical sum signal VO of the signals VPO and VNO. The signal VO will be the output signal of the clock buffer 1. The signal VO will be at the "H" level in response to the signal which changes, among the signals VPO and VNO, into the "H" level thereof earlier.

Figure 2:
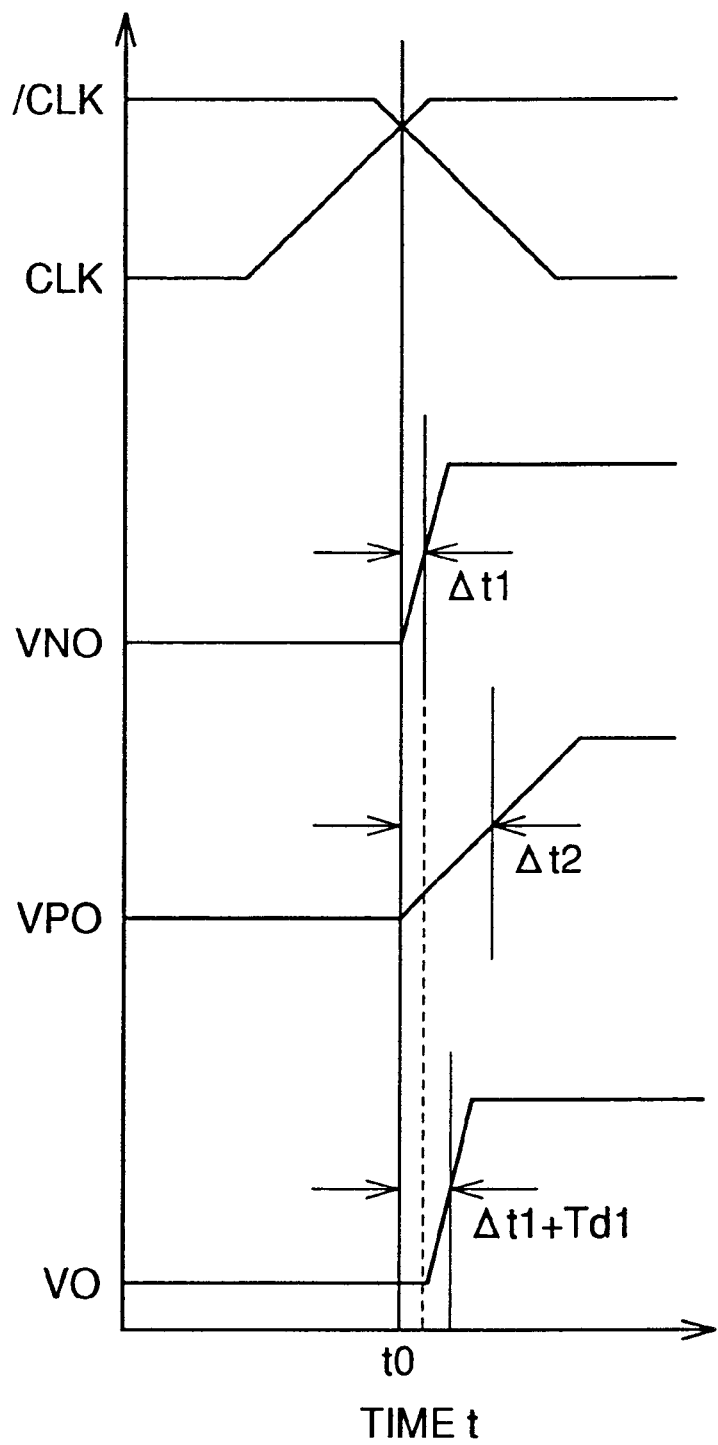
FIG. 2 is a time chart showing the operation of the clock buffer shown in FIG. 1.

The following will describe the operation of the clock buffer 1. FIG. 2 is a time chart showing the case in which the rise timing of the clock signal CLK is earlier than the fall timing of the clock signal /CLK and the cross point where the clock signals CLK and /CLK cross is higher than the potential VCC/2, which is a half of the amplitude potential between the clock signals CLK and /CLK.

In this case, the cross point where the clock signals CLK and /CLK cross each other is near the level of the "H" level:

Therefore, a relatively large electric current flows through the N channel MOS transistors 10 and 11 near the cross point while a relatively small electric current flows through the P channel MOS transistors 3 and 4. For this reason, the response time Δt1 for the rise from the "L" level (ground potential GND) of the signal VNO to the midpoint level (VCC/2) thereof, which starts correspondingly to the cross point, is shorter than the response time Δt2 of the signal VPO. When the signal VNO reaches the midpoint level, the signal VO is raised from the "L" to the "H" level. When the time for the rise from the "L" level of the signal VO to the midpoint level thereof is represented by Td1, the response time for the rise from the "L" level of the signal VO to the midpoint level thereof, which starts correspondingly to the cross point, can be represented by Δt1+Td1.

Figure 3:
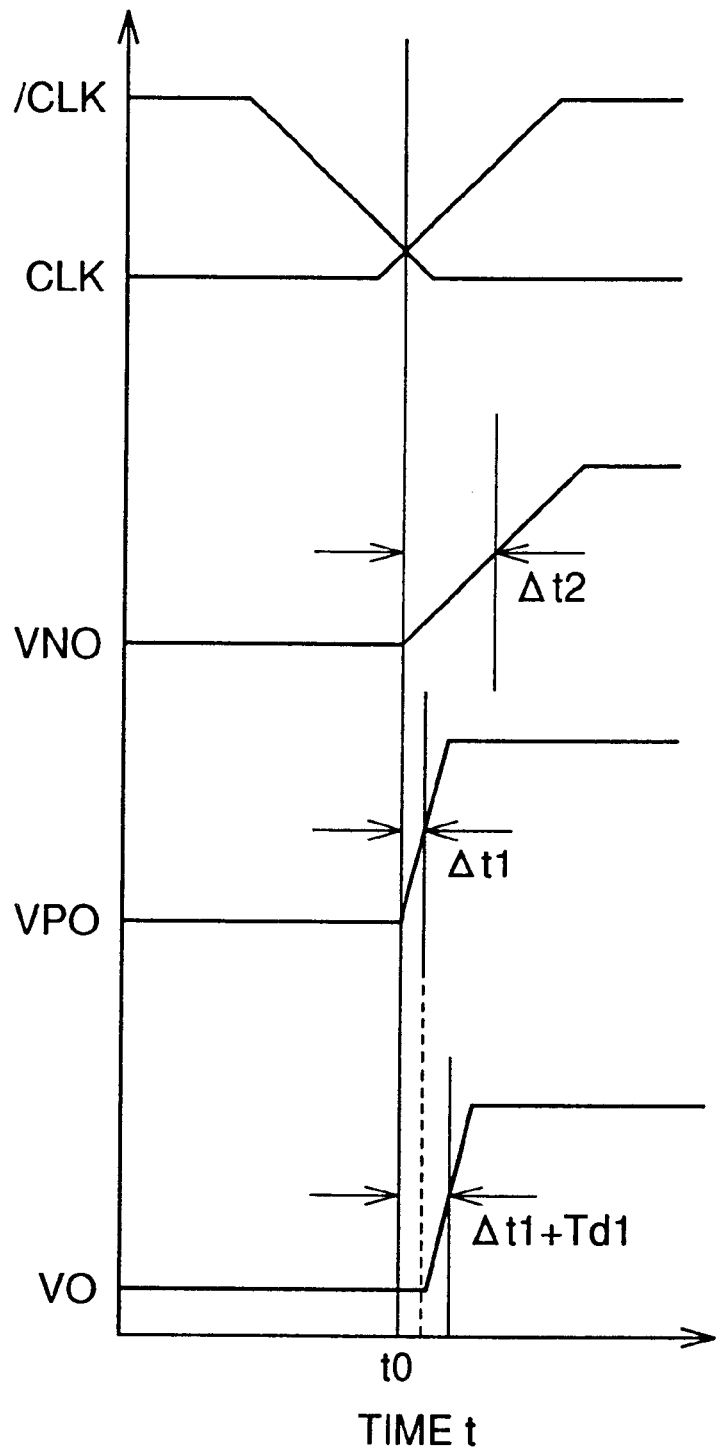
FIG. 3 is another time chart showing the operation of the clock buffer shown in FIG. 1.

FIG. 3 is a time chart showing the operation in the case that the rise timing of the clock signal CLK is later than the fall timing of the clock signal /CLK and further the cross point where the clock signals CLK and /CLK cross is lower than VCC/2.

In this case, the cross point where the clock signals CLK and /CLK cross is near the level of the "L" level. Therefore, a relatively large electric current flows through the N channel MOS transistors 10 and 11 near the cross point while a relatively small electric current flows through the P channel MOS transistors 3 and 4. For this reason, the response time Δt2 for the rise from the "L" level of the signal VNO to the midpoint level thereof, which starts correspondingly to the cross point, is longer than the response time Δt1 of the signal VPO. When the signal VPO reaches the midpoint level, the signal VO is raised from the "L" to the "H" level. The time Td1 for the rise from the "L" level of the signal VO to the midpoint level thereof is constant. Therefore, the response time for the rise from the "L" level of the signal VO to the midpoint level thereof, which starts correspondingly to the cross point, is Δt1+Td1 in both cases shown in FIGS. 2 and 3.

This first embodiment has the compactor 2 in which the gates of the P channel MOS transistors 3 and 4 receive the clock signals CLK and /CLK, and the comparator 7 in which the gates of the N channel MOS transistors 10 and 11 receive the clock signals CLK and /CLK. Furthermore, when the potential of the cross point where the clock signals CLK and /CLK cross is higher than VCC/2, the output signal VNO of the comparator 7 is selected. On the other hand, when the potential of the cross point is lower than VCC/2, the output signal VPO of the comparator 2 is selected. The selected signal VNO or VPO is made to the output signal VO of the clock buffer 1. Therefore, even if the potential at the cross point is scattered; a scatter in the delay time of the clock buffer 1 can be sufficiently suppressed. As a result, the operation of the semiconductor memory device can be made speedy.

Second Embodiment

Figure 4:
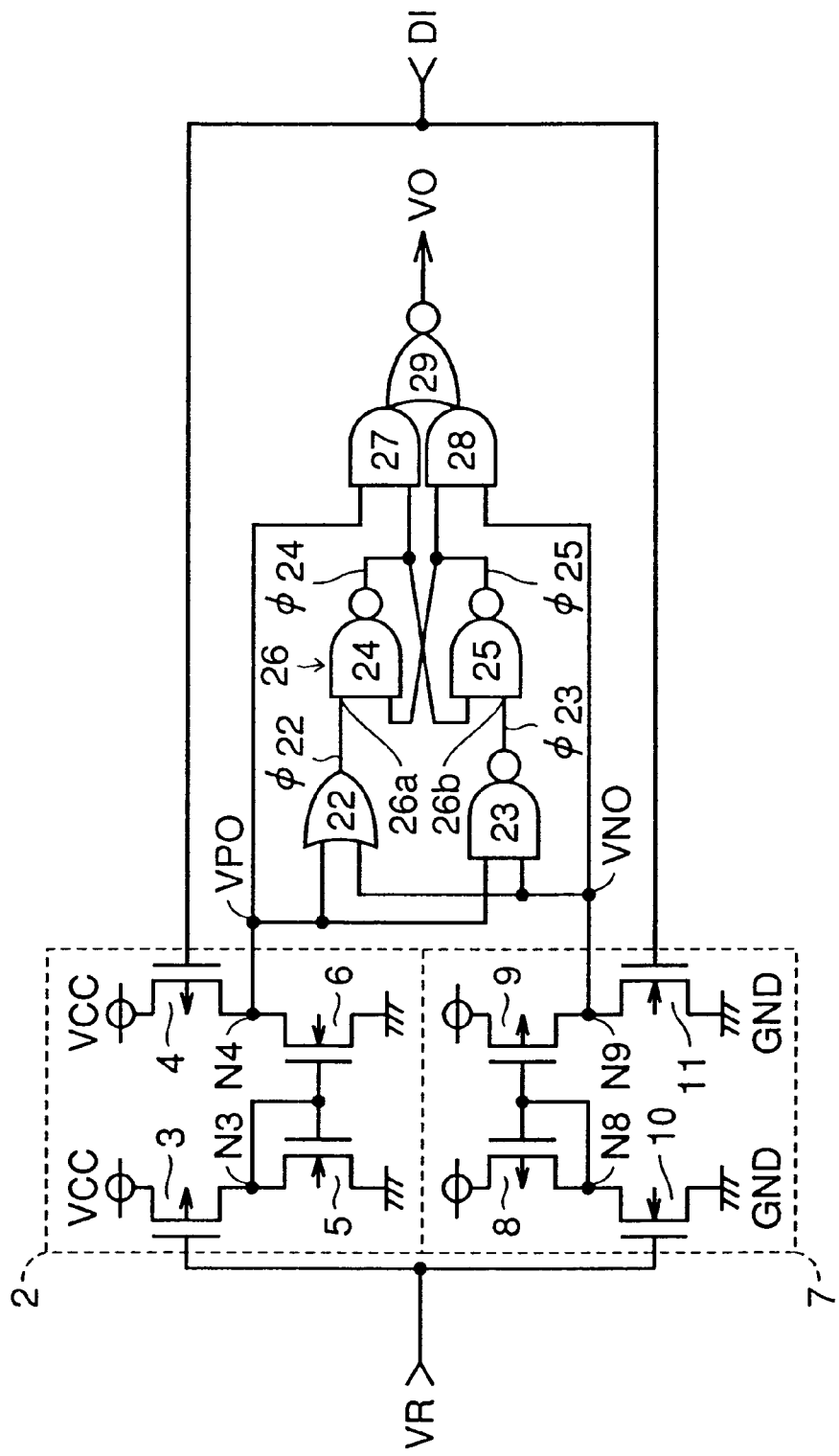
FIG. 4 is a circuit diagram of a data input buffer of a semiconductor memory device according to a second embodiment of the present invention.

FIG. 4 is a circuit diagram of a data input buffer 21 of a semiconductor memory device according to the second embodiment of the present invention. In FIG. 4, this data input buffer 21 has comparators 2 and 7, an OR gate 22, NAND gates 23–25, AND gates 27 and 28, and a NOR gate 29. The NAND gates 24 and 25 constitute a flip-flop 26. The structures of the comparators 2 and 7 are the same as shown in FIG. 1.

The P MOS transistors 3 and 4 of the comparator 2 receive the reference potential VR (VR=VCC/2) and the data signal DI, respectively. When the level of the data signal DI is lower than the reference potential VR, the electric current flowing through the P channel MOS transistor 4 becomes larger than the electric current flowing through the MOS transistors 3, 5 and 6 so that the signal VPO turns into the "H" level. When the level of the data signal DI is higher than the reference potential VR, the electric current flowing through the P channel MOS transistor 4 becomes smaller than the electric current flowing through the MOS transistors 3, 5 and 6 so that the signal VPO turns into the "L" level.

The N channel MOS transistors 10 and 11 of the comparator 7 receive the reference potential VR and the data signal DI, respectively. When the level of the data signal DI is lower than the reference potential VR, the electric current flowing through the N channel MOS transistor 11 becomes smaller than the electric current flowing through the MOS transistors 10, 8 and 9 so that the signal VNO turns into the "H" level. When the level of the data signal DI is higher than the reference potential VR, the electric current flowing through the N channel MOS transistor 11 becomes larger than the electric current flowing through the MOS transistors 10, 8 and 9 so that the signal VNO turns into the "L" level.

The OR gate 22 receives the signal VPO or VNO. An output signal φ22 therefrom is inputted into a set terminal 26a of the flip-flop 26. The NAND gate 23 receives the signal VPO or VNO. An output signal φ23 therefrom is inputted into a reset terminal 26b of the flip-flop 26. The AND gate 27 receives the signal VPO and the output signal φ24 of the flip-flop 26. The NAND gate 28 receives the signal VNO and the reverse output signal φ25 of the flip-flop 26. The NOR gate 29 receives output signals from the AND gates 27 and 28. The output signal of the NOR gate 29 will be the output signal VO of the present data input buffer 21.

Figure 5:
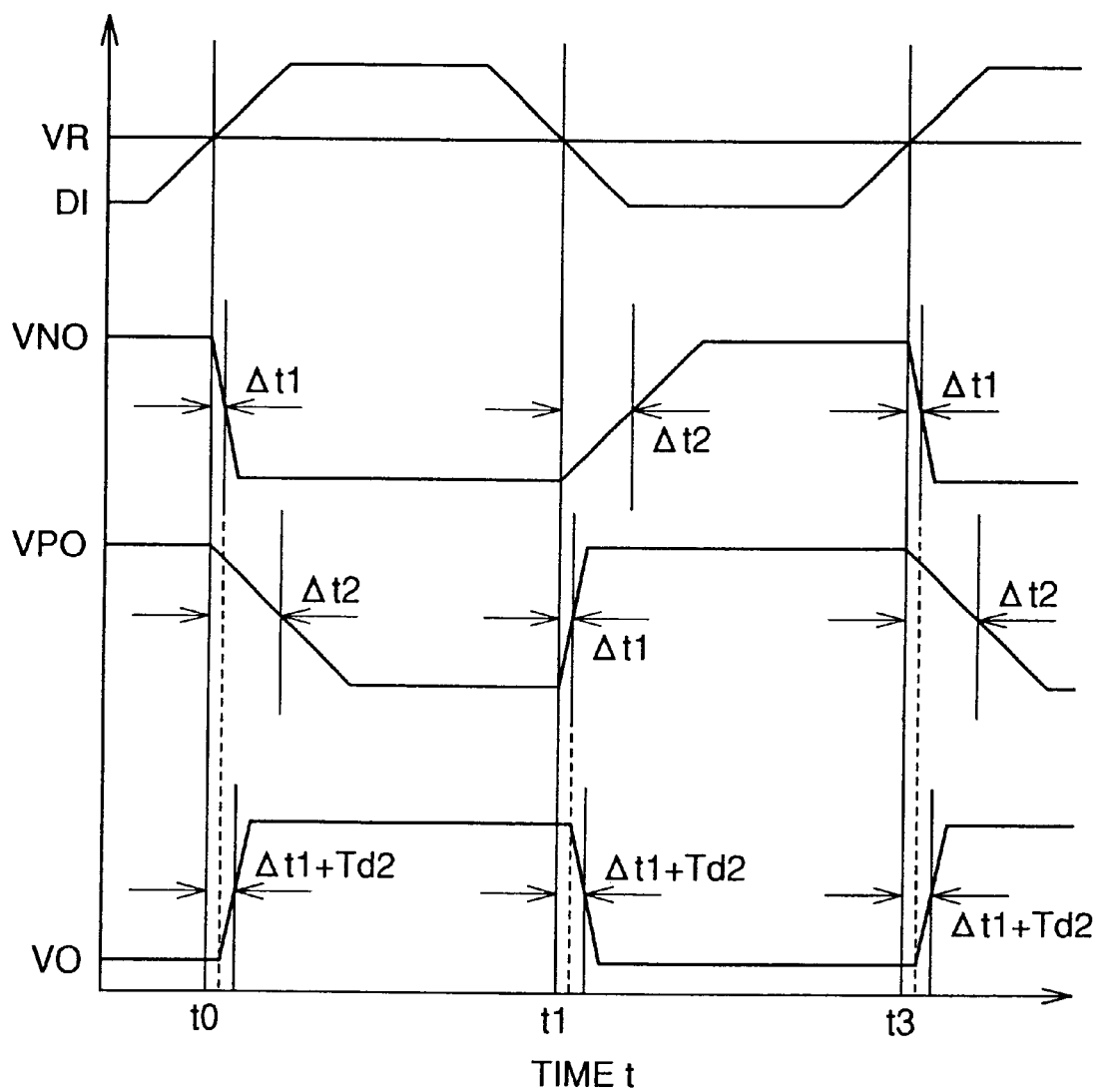
FIG. 5 is a time chart showing the operation of the data input buffer shown in FIG. 4.

FIG. 5 is a time chart showing the operation of the data input buffer 21 shown in FIG. 4. When the data signal DI falls down into the "L" level, both of the signals VPO and VNO turn into the "H" levels so that the signals φ22 and φ23 turn into the "H" level and the "L" level, respectively. Thus, the flip-flop 26 is reset. In this manner, the signals φ24 and φ25 turn into the "L" level and the "H" level, respectively, so that the outputs of the AND gates 27 and 28 turn into the "L" level and the "H" level, respectively. Thus, the signal VO falls into the "L" level.

When the level of the data signal DI rises to become higher than the reference potential VR, both of the signals VPO and VNO fall down from the "H" level to the "L" level. At this time, the level of the data signal DI is near the "H" level rather than the "L" level. Therefore, a relatively large electric current flows through the N channel MOS transistor 11 while a relatively small electric current flows through the P channel MOS transistor 4. As a result, the response time Δt1 for the fall from the "H" level of the signal VNO to the midpoint level thereof, which starts correspondingly to the cross point where the data signal DI and the reference potential VR cross each other, becomes shorter than the response time Δt2 of the signal VPO. When the signal VNO reaches the midpoint level, the output signal of the AND gate 28 turns into the "L" level so that the signal VO is raised from the "L" level to the "H" level. When the delay time of the AND date 28 and the NOR gate 29 is represented by Td2, the response time for the rise from the "L" level of the signal VO to the "H" level thereof, which starts correspondingly to the cross point, can be represented by Δt1+Td2.

When the data signal DI is at the "H" level, both of the signals VPO and VNO turn into the "L" level so that the signals φ22 and φ23 turn into the "L" level and the "H" level, respectively. Thus, the flip-flop 26 is reset. In this manner, the signals φ24 and φ25 turn into the "H" level and "L" level, respectively, so that both of the output signals of the AND gates 27 and 28 turn into the "L" level. Thus, the signal VO turns into the "H" level.

When the level of the data signal DI falls down to become lower than the reference potential VR, both of the signals VPO and VNO rise up from the "L" level to the "H" level. At this time, the level of the data signal DI is near the "L" level rather than the "H" level. Therefore, a relatively small electric current flows through the N channel MOS transistor 11 while a relatively large electric current flows through the P channel MOS transistor 4. As a result, the response time Δt2 for the rise from the "L" level of the signal VNO to the midpoint level thereof, which starts correspondingly to the cross point where the data signal DI and the reference potential VR cross, becomes longer than the response time Δt1 of the signal VPO. When the signal VNO reaches the midpoint level, the output signal of the AND gate 27 turns into the "H" level so that the signal VO is fallen down from the "H" level to the "L" level. When the delay time of the AND date 28 and the NOR gate 29 is represented by Td2, the response time for the fall from the "H" level of the signal VO to the "L" level thereof, which starts correspondingly to the cross point, can be represented by Δt1+Td2.

This second embodiment has the compactor 3 in which the gates of the P channel MOS transistors 3 and 4 receive the reference potential VR and the data signal DI, and the comparator 7 in which the gates of the N channel MOS transistors 10 and 11 receive the reference potential VR and the data signal DI. Furthermore, when the data signal DI rises up from the "L" level to the "H" level, the output signal VNO of the comparator 7 is selected. On the other hand, when the data signal DI falls down from the "H" level to the "L" level, the output signal VPO of the comparator 2 is selected. In response to the selected signal VNO or VPO, the signal VO is generated. It is therefore possible to make the following consistent with each other: the response time of the signal VO in the case that the data signal DI rises up to the "H" level and the response time of the signal VO in the case that the data signal DI falls down to the "L" level. As a result, the operation of the semiconductor memory device can be made speedy.

Third Embodiment

Figure 6:
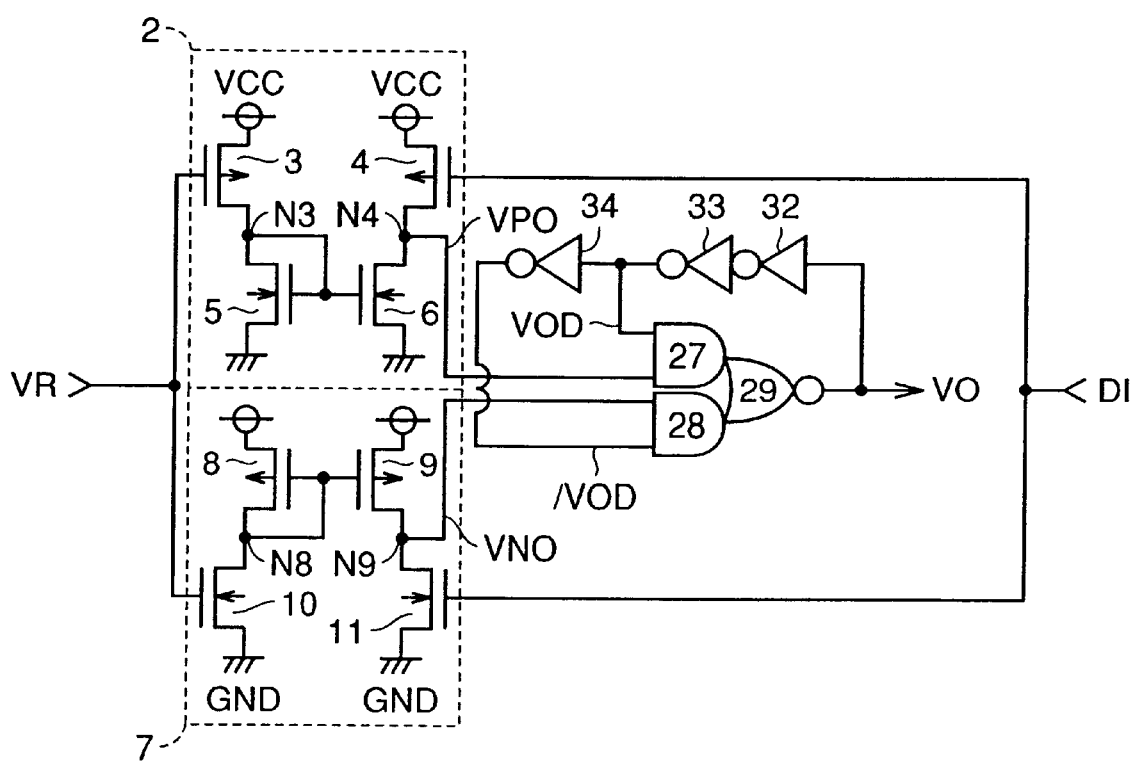
FIG. 6 is a circuit diagram of a data input buffer of a semiconductor memory device according to a third embodiment of the present invention.

FIG. 6 is a circuit diagram of a data input buffer 31 of a semiconductor memory device according to the third embodiment of the present invention. In FIG. 6, a different of this data input buffer 31 from the data input buffer shown in FIG. 4 is in that the OR gate 22 and the NAND gates 23–25 are replaced by inverters 32–34. The output signal VO of the NOR gate 29 is delayed by the inverters 32 and 33 to turn to a signal VOD. The signal VOD is further inverted by the inverter 34 to turn to a signal /VOD. The signals VOD and NOD are inputted to the AND gates 27 and 28, respectively, instead of the signals φ24 and φ25.

Figure 7:
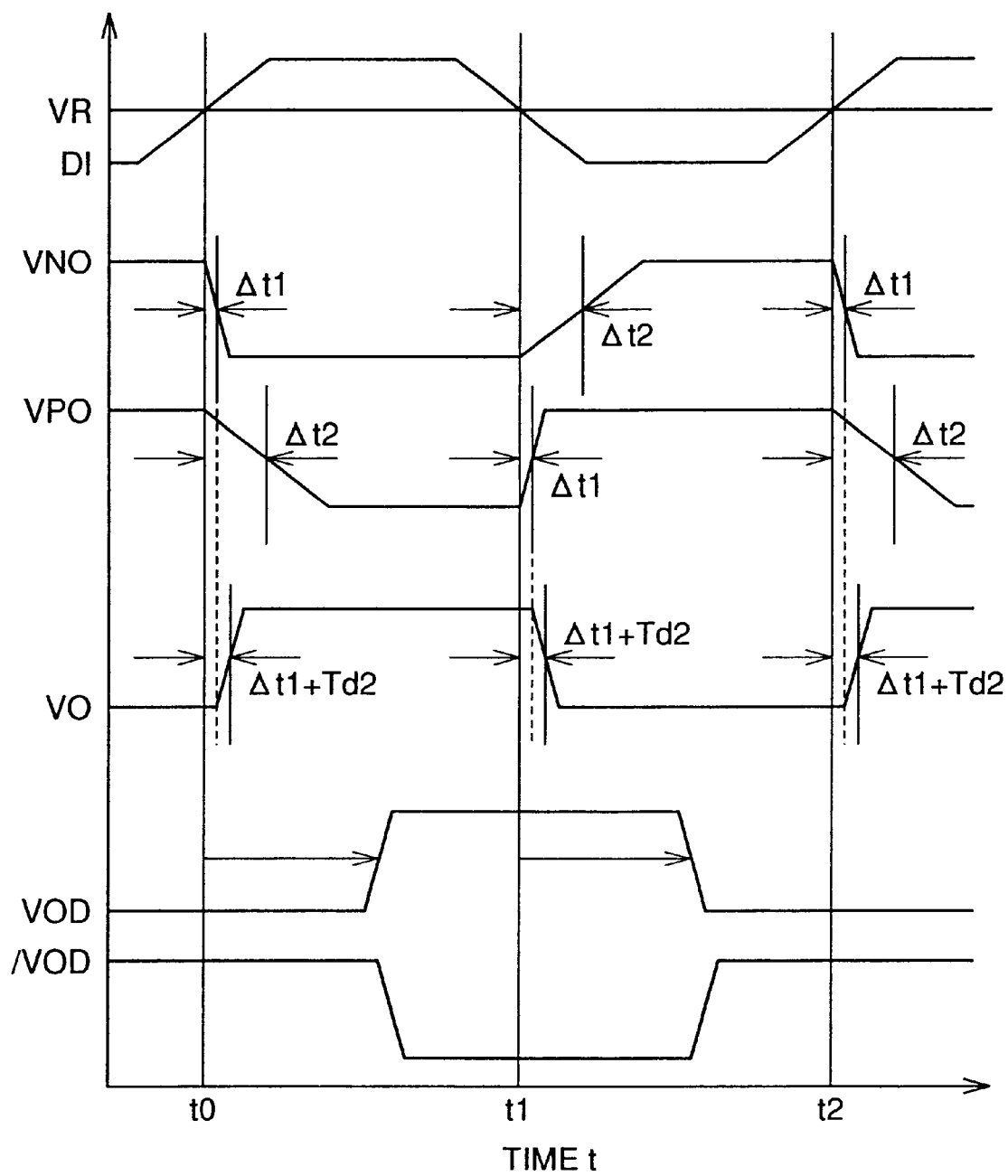
FIG. 7 is a time chart showing the operation of the data input buffer shown in FIG. 6.
Figure 8:
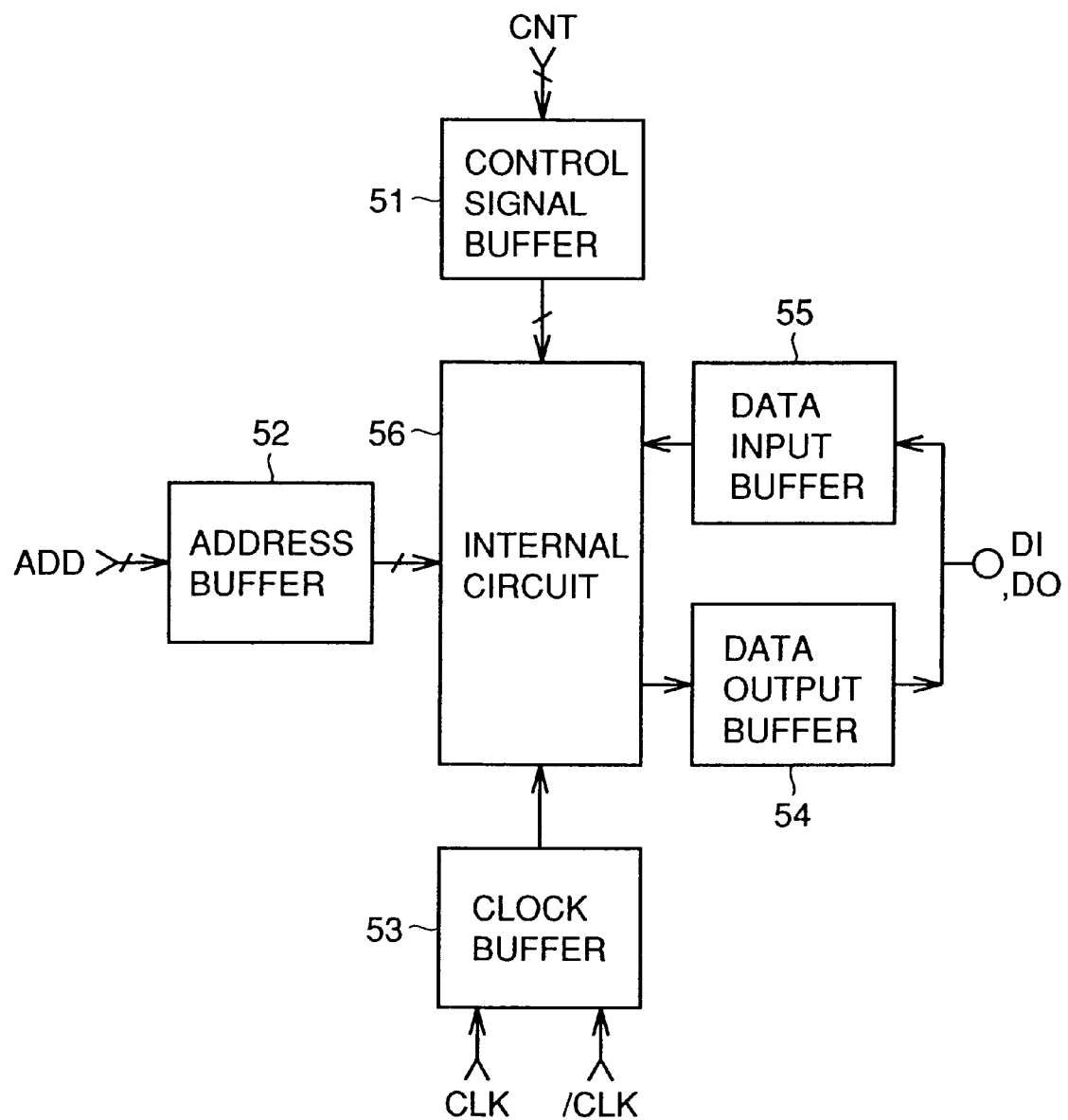
FIG. 8 is a block diagram of a conventional semiconductor memory device.
Figure 9:
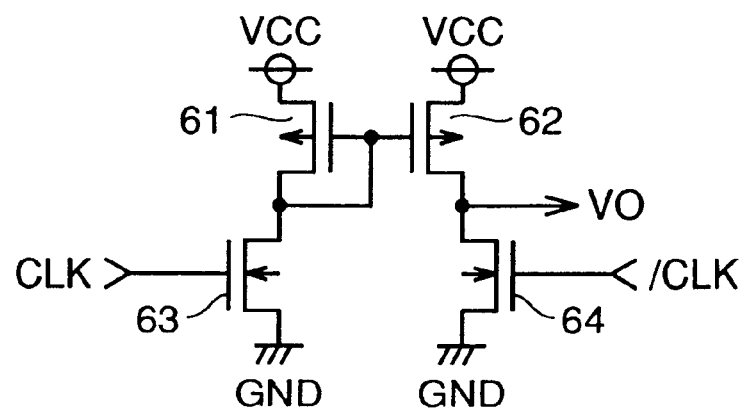
FIG. 9 is a circuit diagram of a clock buffer shown in FIG. 8.
Figure 10:
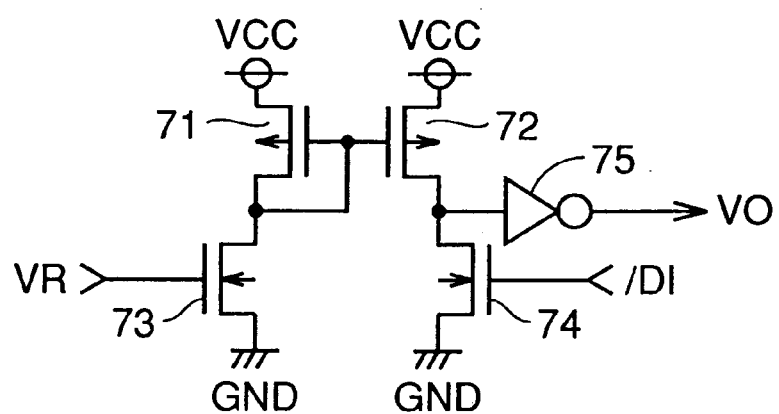
FIG. 10 is a circuit diagram of a data input buffer shown in FIG. 8.
Figure 11A:
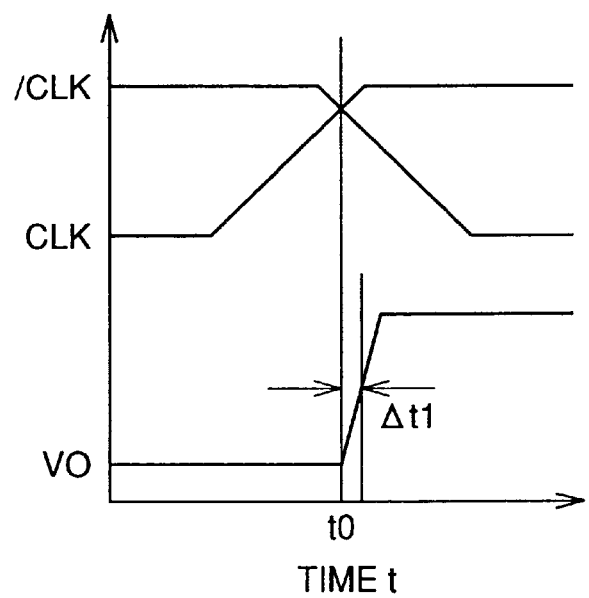
FIGS. 11A and 11B show time charts for explaining a problem in the clock buffer shown in FIG. 9.
Figure 11B:
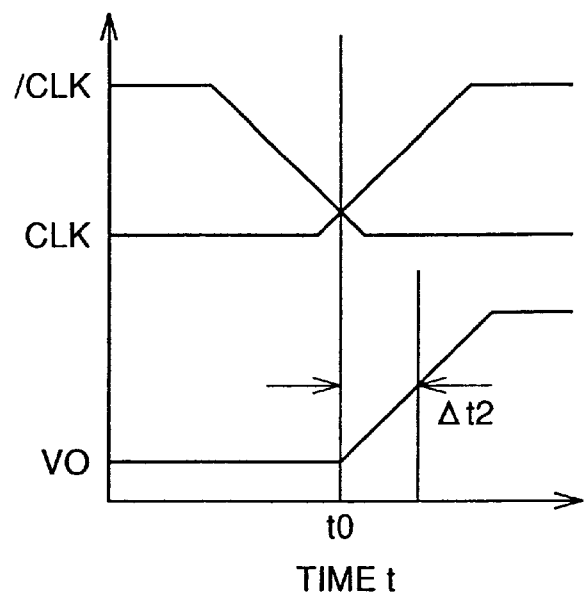
Figure 12:
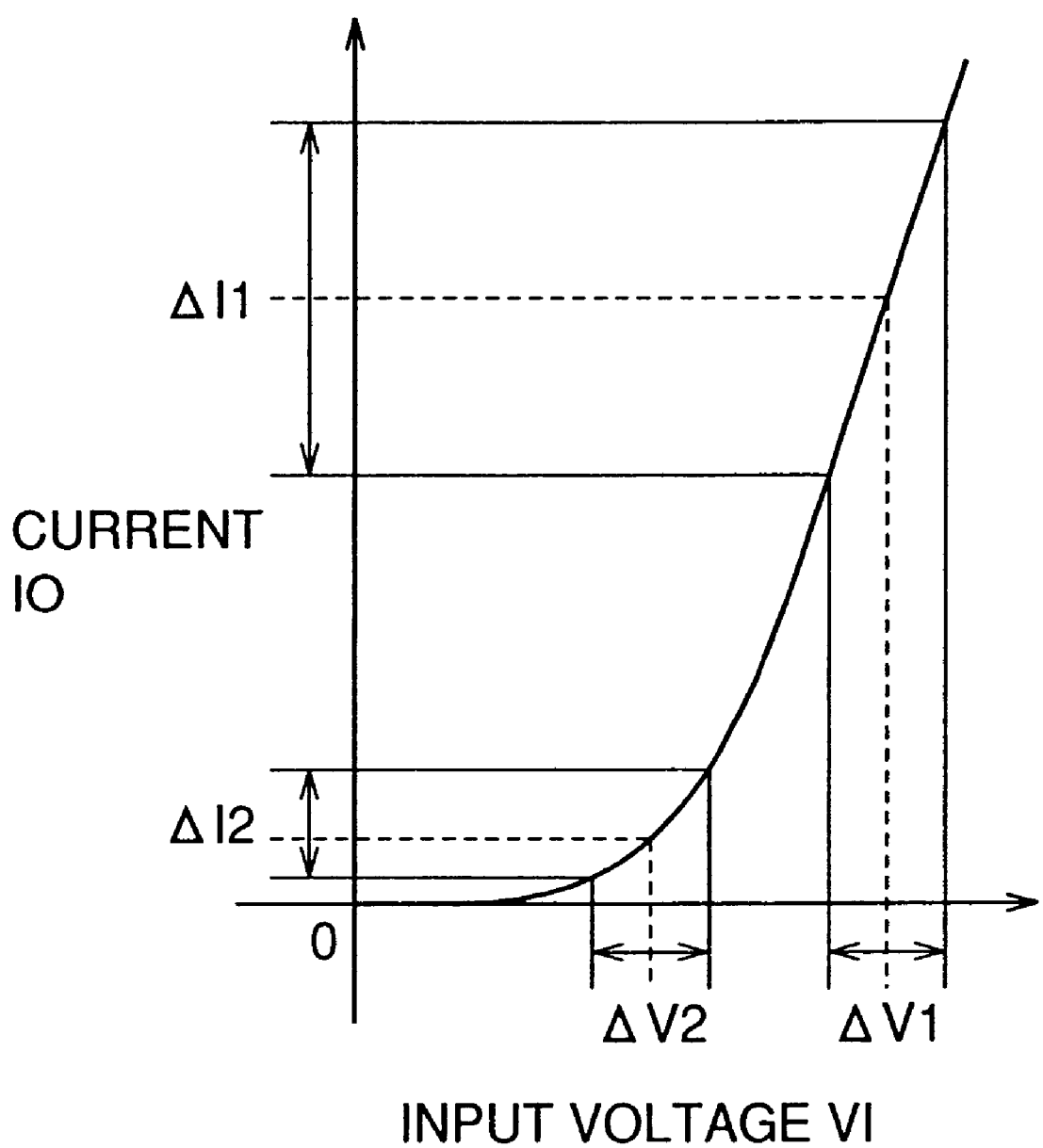
FIG. 12 is a graph for explaining the problem in the clock buffer shown in FIG. 9.
Figure 13A:
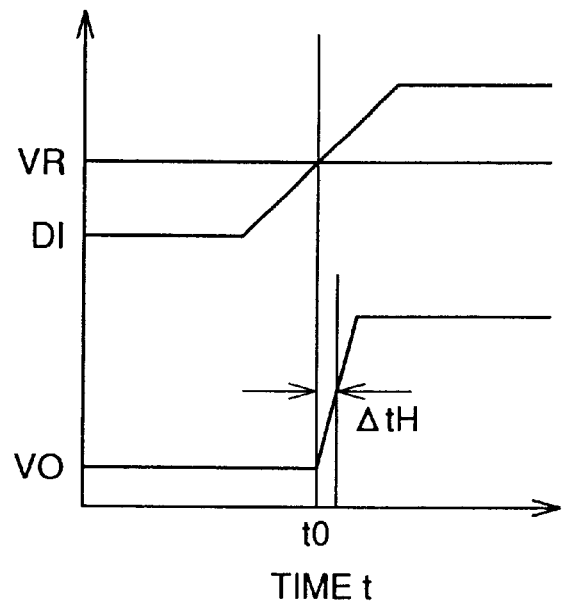
FIGS. 13A and 13B are timing charts for explaining a problem of the data input buffer shown in FIG. 10.
Figure 13B:
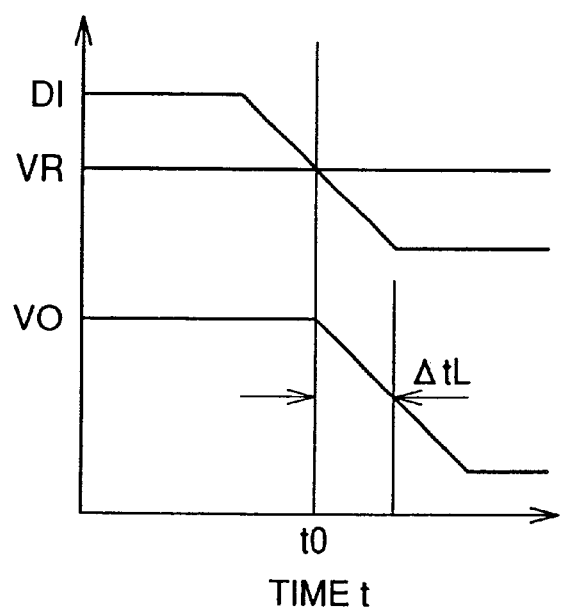
Figure 14:
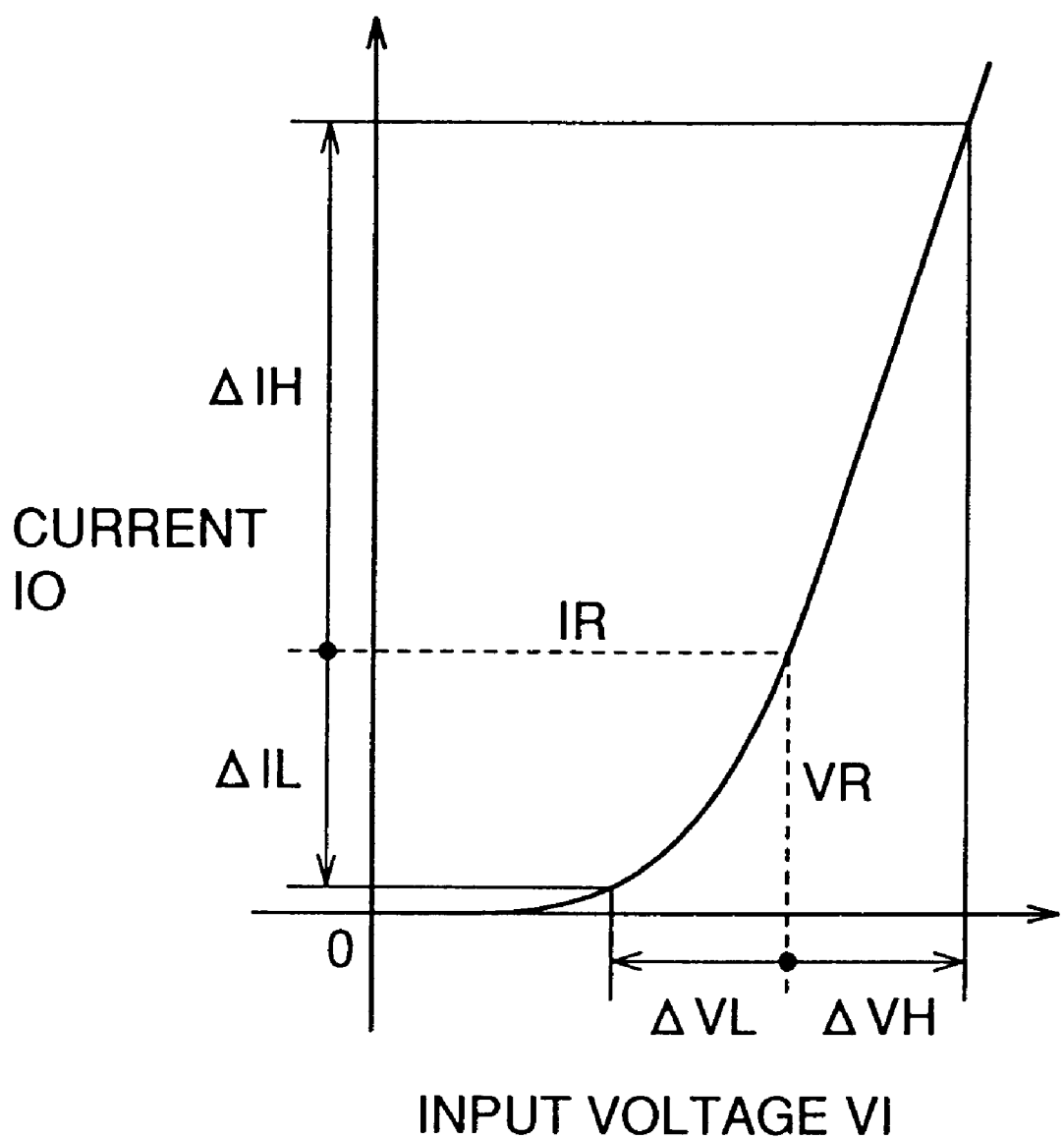
FIG. 14 is a graph for explaining the problem of the data input buffer shown in FIG. 10.

FIG. 7 is a time chart showing the operation of the data input buffer 31 shown in FIG. 6. In the case that the data signal is at the "L" level, both of the signals VPO and VNO are at the "H" level. The signals VOD and /VOD are at the "L" level and at the "H" level, respectively. Thus, the signal VO is at the "L" level.

When the level of the data signal DI rises to become higher than the reference potential VR, both of the signals VPO and VNO fall down from the "H" level to the "L" level. At this time, the level of the data signal DI is near the "H" level rather than the "L" level. Therefore, the response time Δt1 for the fall from the "H" level of the signal VNO to the midpoint level thereof, which starts correspondingly to the cross point where the data signal DI and the reference potential VR cross, becomes shorter than the response time Δt2 of the signal VPO. When the signal VNO reaches the midpoint level, the output signal of the AND gate 28 turns into the "L" level so that the signal VO is raised from the "L" level to the "H" level. When the delay time of the AND date 28 and the NOR gate 29 is represented by Td2, the response time for the rise from the "L" level of the signal VO to the "H" level thereof, which starts correspondingly to the cross point, can be represented by Δt1+Td2.

When the data signal DI is at the "H" level, both of the signals VPO and VNO are at the "L" level. The signals VOD and NOD are at the "H" level and at the "L" level, respectively. Thus, the signal VO is at the "H" level.

When the level of the data signal DI falls down to become higher than the reference potential VR, both of the signals VPO and VNO rise up from the "L" level to the "H" level. At this time, the level of the data signal DI is near the "H" level rather than the "L" level. Therefore, the response time Δt2 for the rise from the "L" level of the signal VNO to the midpoint level thereof, which starts correspondingly to the cross point where the data signal DI and the reference potential VR cross, becomes longer than the response time Δd1 of the signal VPO. When the signal VPO reaches the midpoint level, the output signal of the AND gate 27 turns into the "H" level so that the signal VO is fallen down from the "H" level to the "L" level. When the delay time of the AND date 27 and the NOR gate 29 is represented by Td2, the response time for the fall from the "H" level of the signal VO to the "L" level thereof, which starts correspondingly to the cross point, can be represented by Δt1+Td2.

In this third embodiment, the same advantages in the second embodiment can be produced.

It should be considered that the embodiments disclosed in the specification are illustrative and are not restrictive. The scope of the present invention is not defined by the above-mentioned description but is defined by the appended claims. The present invention includes all modifications within the meaning and the scope equivalent to the claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer of a semiconductor device which generates an internal signal in response to an external signal and supplies the internal signal to an internal circuit, including:
   a first comparator including first and second transistors of first conduction type, input electrodes of which receive said external signal and a reference signal respectively, said first comparator changing a first signal from a first level to a second level in response to the fact that the level of said external signal exceeds the level of said reference signal,
   a second comparator including third and fourth transistors of second conduction type, input electrodes of which receive said external signal and said reference signal respectively, said second comparator changing a second signal from said first level to said second level in response to the fact that the level of said external signal exceeds the level of said reference signal, and a logic circuit that changes said internal signal from an inactive level to an active level in response to the fact that either one of said first or second signal turns into a third level between said first and second levels.

2. The input buffer of the semiconductor device according to claim 1, wherein said first comparator changes said first signal from said second level to said first level in response to the fact that the level of said external signal becomes lower than the level of said reference signal, said second comparator changes said second signal from said second level to said first level in response to the fact that the level of said external signal becomes lower than the level of said reference signal, and when said internal signal is at said inactive level, said logic circuit sets said internal signal to said active level in response to the fact that either one of said first or second signal turns into said third level, and when said internal signal is at said active level, said logic circuit sets said internal signal to said inactive level in response to the fact that either one of said first or second signal turns into said third level.

3. The input buffer of the semiconductor device according to claim 1, wherein said reference signal is a signal complementary to said external signal.

4. The input buffer of the semiconductor device according to claim 1, wherein one level of said external signals is equal to the first potential and the other level is equal to the second potential, and said reference signal is fixed to a third potential between said first and second potentials.

5. The input buffer of the semiconductor device according to claim 1, wherein said first comparator further includes a first current mirror circuit connected to said first and second transistors, said current mirror circuit being for setting said first signal to said first level when a first electric current flowing through said first transistor is smaller than a second electric current flowing through said second transistor, and setting said first signal to said second level when said first electric current is larger than said second electric current, and said second comparator further includes a second current mirror circuit connected to said third and fourth transistors, said second current mirror circuit being for setting said second signal to said first level when a third electric current flowing through said third transistor is larger than a fourth electric current flowing through said fourth transistor, and setting said second signal to said second level when said third electric current is smaller than said fourth electric current.

6. An input buffer of a semiconductor device which generates an internal signal in response to an external signal and supplies the internal signal to an internal circuit, including:

a first comparator including first and second transistors of first conduction type, input electrodes of which receive said external signal and a reference potential respectively, said first comparator comparing the level of said external signal with said reference potential to output a signal having a level corresponding to the comparison result, a second comparator including third and fourth transistors of second conduction type, input electrodes of which receive said external signal and said reference potential respectively, said second comparator comparing the level of said external signal with said reference potential to output a signal having a level corresponding to the comparison result, and a selection logic circuit that receives output signals of said first and second comparators, selects the output signal of said first comparator when said external signal changes from said first level to said second level, and selects the output signal of said second comparator when said external signal changes from said second level to said first level, so as to change the level of said internal signal in response to the fact that the level of the selected signal changes.

7. The input buffer of the semiconductor device according to claim 6, wherein said selection logic circuit selects the output signal of either one of said first or second comparator on the basis of combination of the levels of the output signals of said first and second comparators immediately before the level of said external signal changes.

8. The input buffer of the semiconductor device according to claim 6, wherein said selection logic circuit receives said internal signal to select the output signal of either one of said first or second comparator on the basis of the level of said internal signal.

* * * * *